May 19, 1970
KAZUO ITO
3,512,352
FREQUENCY REGULATOR AND METHOD FOR REGULATING FREQUENCY OF ELECTRIC TIMEPIECES
Filed March 27, 1968

3,512,352

FREQUENCY REGULATOR AND METHOD FOR REGULATING FREQUENCY OF ELECTRIC TIMEPIECES

Kazuo Ito, Tokyo, Japan, assignor to Kabushiki Kaisha Daini Seikosha, Tokyo, Japan, a company of Japan Filed Mar. 27, 1968, Ser. No. 716,381
Claims priority, application Japan, Apr. 12, 1967, 42/23,096
Int. Cl. G04c *3/00*
U.S. Cl. 58—23 3 Claims

ABSTRACT OF THE DISCLOSURE

A frequency regulator or standard and method for regulating the frequency of electric time-keeping devices. A timing fork having its natural oscillation frequency varied by a transistor signal source applying driving signals to the tuning fork through an adjustable variable resistor connected between a driving transducer and the collector of the transistor to vary the phase of the driving signals. A detecting transducer detects the mechanical oscillations of the tuning fork and develops a detection voltage applied to the transistor for amplification.

The present invention relates generally to electric timepieces and more particularly to regulating devices for regulating the frequency of such electric timepieces or time-keeping devices.

Frequency regulators or standards for time-keeping devices are known in which a tuning fork is used as the mechanical oscillator and piezoelectric transducers are used in conjunction therewith. The natural frequency of oscillation of the known tuning forks is determined by the natural frequency of the tuning fork itself and that of the piezoelectric elements driving it and detecting the mechanical oscillations as well as the natural frequency of the adhesive layer between the tuning fork and the piezoelectric elements. It is thus very difficult to make many piezoelectric tuning forks which have the same natural frequency because the natural frequency of the tuning forks may differ from tuning fork to tuning fork due to a little difference in material, shape or size, etc.

In the past the adjusting of the frequency of an electric timepiece or time-keeping device using a tuning fork as a frequency standard was performed by shifting the center of gravity of the tuning fork by means of masses set movably on a pair of tines. This kind of an adjustment, however, requires a skilled technician and because the center of gravity of each tine must be adjusted to the same value the adjustment is quite hard to carry out. This is one reason why electric timepieces, particularly watches, comprising a tuning fork as a frequency standard have never become highly popular.

A principal object of the present invention is to provide a frequency adjustment in a frequency regulator for time-keeping devices by regulating the oscillating circuit of the frequency regulator instead of the natural frequency of a tuning fork.

Another object of the present invention is to provide a frequency regulating device for electric timepieces in which the shifting of the vibration of the tines from their natural frequency is accomplished by regulating the driving phase of a piezoelectric tuning fork.

The frequency regulator according to the invention comprises a mechanical oscillator comprising a tuning fork having its own natural oscillation frequency and to which are connected transducers for applying a driving signal and taking out a detecting signal. A transistor provides the driving signal and is its source and receives the detection voltage. An adjust variable resistor is connected between the driving transducer and the collector of the transistor which receives and amplifies the detection voltage.

Other features and advantages of the frequency regulator for time-keeping devices in accordance with the present invention will be better understood as described in the following specification and appended claims, in conjunction with the following drawings in which:

Figure 1:
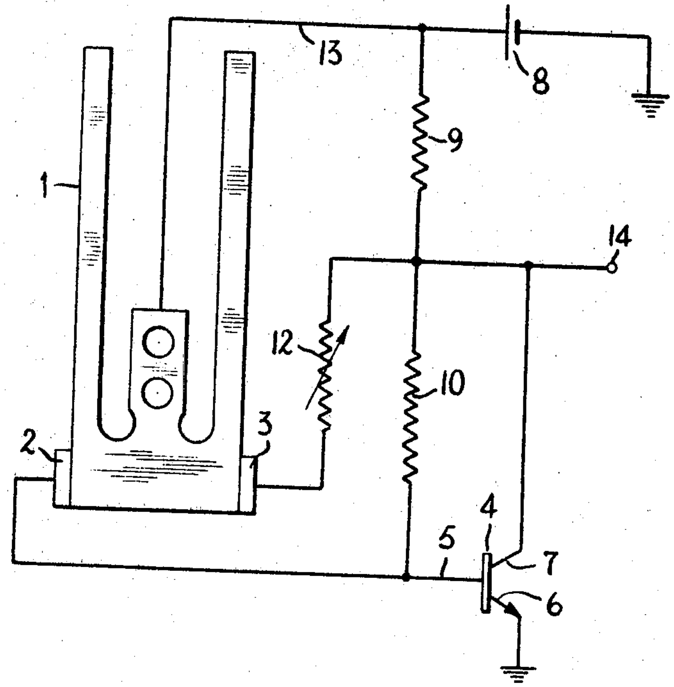
FIG. 1, is a schematic circuit of a frequency regulator in accordance with the invention.

The frequency regulator in accordance with the invention is shown in FIG. 1. It comprises a tuning fork 1 on which is mounted a piezoelectric element or transducer 2 which detects the mechanical oscillations of the transducer and converts them to a detection voltage. A driving piezoelectric element or transducer 3 is likewise mounted on the tuning fork for applying a driving signal or pulses from a transistor 4 to which it is connected. The piezoelectric elements are made of barium titanate and are bonded or adhered to the tuning fork by an adhesive or bonding agent.

The detection transducer 2 is connected to a base 5 of the transistor 4 which has its emitter 6 grounded and a collector 7 connected to a plus terminal of a battery or power source 8 through a resistor 9. The minus or negative terminal of the battery is grounded as illustrated. A base resistor 10 is connected in series with the resistor 9 and is connected to the base as illustrated. The base resistor 10 is essentially connected between the collector 7 and base 5 and the output or driving signal of the transistor is negatively fed back to the base 5 through the base resistor 10. The collector 7 is likewise connected to the driving piezoelectric element 3 through an adjust variable resistor 12. A connection 13 is made between the base of the tuning fork 1 and the battery 8 and the output of the device is taken out at a terminal 14.

Figure 2:
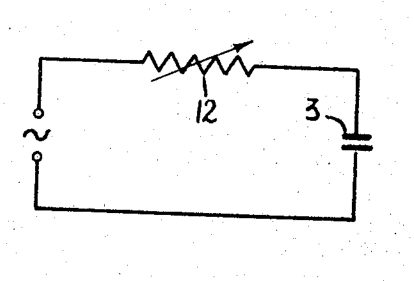
FIG. 2, is an equivalent circuit of the oscillating circuit in FIG. 1.
Figure 3:
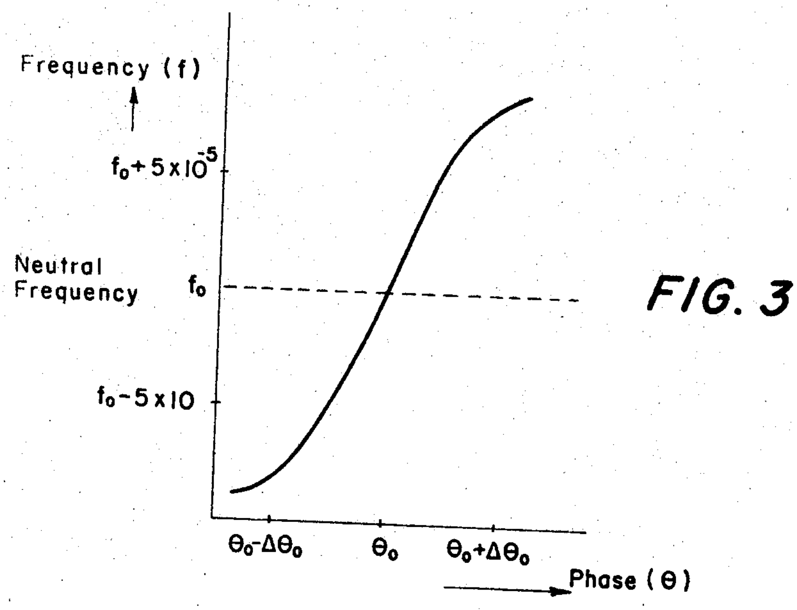
FIG. 3, is a graph illustrating the relation between the phase of the driving signal and the frequency of the tuning fork of FIG. 1.

The oscillating circuit piezoelectric elements 2, 3 are made of dielectric material so that the circuit has electrostatic capacity. Thus if collector 7 of the transistor 4 is a signal source the variable resistor 12 and the electrostatic capacity form an integrated circuit shown as an equivalent circuit in FIG. 2. It can be seen from FIG. 2 that transmission of the signal is delayed in phase because of the existence of this integrated circuit. Generally when a vibrator is driven at a position of maximum natural frequency it continues oscillation at its natural frequency. It is known by Airy's law that, in case the phase of a driving signal is delayed at the position of maximum speed of natural frequency the frequency of the oscillation of the vibrator becomes lower than the natural frequency as illustrated in FIG. 3.

In the embodiment illustrated in FIG. 1 the base resistor 10 is disposed as indicated between the collector 7 and the base 5 and admittance negative feed back is formed. Therefore the operative impedance of the transistor 4 is dropped and the electrostatic capacity between the collector 7 and the base 5 is decreased and at the same time delay of the phase in the process of amplification is improved. As a result, variation of the phase is almost in direct proportion to the value of the variable resistor in the narrow area which is necessary in regulation of timepieces. In this narrow area the natural frequency of the vibrator or tuning fork is in direct proportion to the shift of phase. The oscillating frequency of the vibrator is in direct proportion to the value of the variable resistor 12, therefore the value of each natural frequency of each vibrator tine can be completely modified by the variable resistor 12. For example, it is possible to modify the frequency without error when using a tuning fork having a quality factor Q of 2,000 to 3,000 and a variable resistor of 100K Ω because daily rate is in direction proportion to the value of the variable resistor, and if this error being modified is lower than ±five seconds a day.

Thus the regulation of the frequency standard by the use of a variable resistor between the collector of a transistor driving signal source and the driving piezoelectric element of the transducer makes it possible to produce electric timepieces which have a very simple construction and a very small size. Moreover, as the base resistor disposed between the collector and the base of the transistor forms admittance negative feed back variations of the resistance between the collector and the driving transducer is in direction proportion to variation of oscillation and as a consequence regulation of electric timepieces becomes quite easy and accurate.

While a preferred embodiment of the invention has been shown and described it will be understood that many modifications and changes can be made within the true spirit and scope of the invention.

What I claim and desire to be secured by Letters Patent is:

1. A frequency regulator for an electric time-keeping device for regulating the frequency thereof comprising, a mechanical oscillator comprising a tuning fork having a natural oscillation frequency, means to apply a driving signal to said mechanical oscillator comprising a driving signal source, said driving signal source comprising a transistor having electrodes comprising a base, collector and emitter, a source of power for said transistor, first transducer means applying a driving signal from said signal source to said mechanical oscillator, a second transducer detecting mechanical oscillations of said mechanical oscillator and converting said mechanical oscillations to a detecting voltage, means connecting the second transducer to said transistor for amplification of said detecting voltage by said transistor, and a variable resistor connected between the collector and said first transducer to vary the oscillation frequency of said mechanical oscillator in accordance with the resistance value of said resistor.

2. A frequency regulator for an electric time-keeping device according to claim 1, including means to take out a signal for regulating the frequency of said time-piece.

3. A frequency regulator for an electric time-keeping device according to claim 1, including a base resistor connected between said base and collector electrodes to stabilize the period of oscillation of said mechanical oscillator and to improve phase delay during amplification of said detecting voltage.

References Cited

FOREIGN PATENTS

| | | |
|---|---|---|
| 993,140 | 5/1965 | Great Britain. |
| 1,473,362 | 2/1967 | France. |
| 1,480,079 | 5/1967 | France. |

RICHARD B. WILKINSON, Primary Examiner

E. C. SIMMONS, Assistant Examiner

U.S. Cl. X.R.

58—154